(12) United States Patent
Veillette

(10) Patent No.: US 9,013,173 B2
(45) Date of Patent: Apr. 21, 2015

(54) PROCESS FOR DETECTING ENERGY THEFT

(75) Inventor: Michel Veillette, Waterloo (CA)

(73) Assignee: Trilliant Networks, Inc., Redwood City, CA (US)

( * ) Notice: Subject to any disclaimer, the term of this patent is extended or adjusted under 35 U.S.C. 154(b) by 775 days.

(21) Appl. No.: 13/231,010

(22) Filed: Sep. 13, 2011

(65) Prior Publication Data

US 2012/0062210 A1 Mar. 15, 2012

Related U.S. Application Data

(60) Provisional application No. 61/382,057, filed on Sep. 13, 2010.

(51) Int. Cl.
*G01R 21/00* (2006.01)
*H04Q 9/00* (2006.01)
*G01D 4/00* (2006.01)

(52) U.S. Cl.
CPC ............. *H04Q 9/00* (2013.01); *H04Q 2209/60* (2013.01); *G01D 4/002* (2013.01); *Y02B 90/241* (2013.01); *Y04S 20/32* (2013.01); *Y04S 20/36* (2013.01)

(58) Field of Classification Search
None
See application file for complete search history.

(56) References Cited

U.S. PATENT DOCUMENTS

| | | | | |
|---|---|---|---|---|
| 4,132,981 A | 1/1979 | White | | 340/203 |
| 4,190,800 A | 2/1980 | Kelly, Jr. et al. | | 325/37 |
| 4,204,195 A | 5/1980 | Bogacki | | 340/151 |
| 4,254,472 A | 3/1981 | Juengel et al. | | 364/900 |
| 4,322,842 A | 3/1982 | Martinez | | 370/11 |
| 4,396,915 A | 8/1983 | Farnsworth et al. | | 340/870.03 |
| 4,425,628 A | 1/1984 | Bedard et al. | | 364/900 |
| 4,638,314 A | 1/1987 | Keller | | 340/870.02 |
| 4,644,320 A | 2/1987 | Carr et al. | | 340/12.37 |
| 4,749,992 A | 6/1988 | Fitzemeyer et al. | | 340/870.02 |
| 4,792,946 A | 12/1988 | Mayo | | 370/245 |

(Continued)

FOREIGN PATENT DOCUMENTS

| | | | | |
|---|---|---|---|---|
| EP | 0 578 041 B1 | 11/1999 | | H04L 12/56 |
| EP | 0 663 746 B1 | 1/2003 | | H04L 12/46 |

(Continued)

OTHER PUBLICATIONS

Hydro One Networks, Inc., Request for Proposal for Smart Metering Services, 16 pp., Mar. 4, 2005.

(Continued)

*Primary Examiner* — Melissa Koval
*Assistant Examiner* — Stephen G Armstrong
(74) *Attorney, Agent, or Firm* — Moser Taboada

(57) ABSTRACT

The present invention relates generally to detecting energy theft within an energy distribution system and more particularly to systems and methods for detecting energy discrepancies in voltages and/or currents reported by electric meters present in a distribution circuit, without requiring installation of additional hardware at the transformer. Typically, the location of each of at least two meters is determined with respect to a transformer. The line resistances within the distribution circuit are determined starting with a line resistance farthest from the transformer. Estimated line voltages are determined for at least one electric meter using the estimated line resistances, and the estimated voltages are compared to actual voltage readings for the at least one electric meter. The existence of line loss is determined based on this comparison.

19 Claims, 4 Drawing Sheets

(56) References Cited

U.S. PATENT DOCUMENTS

| | | | |
|---|---|---|---|
| 4,939,726 A | 7/1990 | Flammer et al. | 370/400 |
| 5,007,052 A | 4/1991 | Flammer | 370/389 |
| 5,056,107 A | 10/1991 | Johnson et al. | 375/138 |
| 5,077,753 A | 12/1991 | Grau, Jr. et al. | 375/141 |
| 5,079,768 A | 1/1992 | Flammer | 370/349 |
| 5,115,433 A | 5/1992 | Baran et al. | 370/400 |
| 5,117,422 A | 5/1992 | Hauptschein et al. | 370/255 |
| 5,130,987 A | 7/1992 | Flammer | 370/436 |
| 5,138,615 A | 8/1992 | Lamport et al. | 370/94.3 |
| 5,159,592 A | 10/1992 | Perkins | 370/338 |
| 5,216,623 A | 6/1993 | Barrett et al. | 364/550 |
| 5,276,680 A | 1/1994 | Messenger | 370/311 |
| 5,311,581 A | 5/1994 | Merriam et al. | 379/106.07 |
| 5,400,338 A | 3/1995 | Flammer, III et al. | 370/255 |
| 5,430,729 A | 7/1995 | Rahnema | 370/409 |
| 5,432,507 A | 7/1995 | Mussino et al. | 340/870.03 |
| 5,453,977 A | 9/1995 | Flammer, III et al. | 370/254 |
| 5,459,727 A | 10/1995 | Vannucci | 370/332 |
| 5,463,777 A | 10/1995 | Bialkowski et al. | 1/1 |
| 5,465,398 A | 11/1995 | Flammer | 455/69 |
| 5,467,345 A | 11/1995 | Cutter, Jr. et al. | 370/229 |
| 5,471,469 A | 11/1995 | Flammer, III et al. | 370/254 |
| 5,479,400 A | 12/1995 | Dilworth et al. | 370/331 |
| 5,488,608 A | 1/1996 | Flammer, III | 370/400 |
| 5,515,369 A | 5/1996 | Flammer, III et al. | 370/480 |
| 5,515,509 A | 5/1996 | Rom | 709/228 |
| 5,528,507 A | 6/1996 | McNamara et al. | 700/286 |
| 5,544,036 A | 8/1996 | Brown, Jr. et al. | 364/145 |
| 5,553,094 A | 9/1996 | Johnson et al. | 375/130 |
| 5,570,084 A | 10/1996 | Retter et al. | 370/338 |
| 5,572,528 A | 11/1996 | Shuen | 370/402 |
| 5,596,722 A | 1/1997 | Rahnema | 709/241 |
| 5,608,721 A | 3/1997 | Natarajan et al. | 370/238 |
| 5,608,780 A | 3/1997 | Gerszberg et al. | 455/436 |
| 5,623,495 A | 4/1997 | Eng et al. | 370/397 |
| 5,659,300 A | 8/1997 | Dresselhuys et al. | 340/870.02 |
| 5,673,252 A | 9/1997 | Johnson et al. | 370/449 |
| 5,696,501 A | 12/1997 | Ouellette et al. | 340/870.02 |
| 5,717,718 A | 2/1998 | Rowsell et al. | 375/260 |
| 5,719,564 A | 2/1998 | Sears | 340/870.02 |
| 5,726,644 A | 3/1998 | Jednacz et al. | 340/825.52 |
| 5,727,057 A | 3/1998 | Emery et al. | 379/201.07 |
| 5,737,318 A | 4/1998 | Melnik | 370/254 |
| 5,740,366 A | 4/1998 | Mahany et al. | 709/227 |
| 5,748,104 A | 5/1998 | Argyroudis et al. | 340/870.11 |
| 5,757,783 A | 5/1998 | Eng et al. | 370/315 |
| 5,758,331 A | 5/1998 | Johnson | 705/412 |
| 5,761,083 A | 6/1998 | Brown, Jr. et al. | 364/492 |
| 5,767,790 A | 6/1998 | Jovellana | 340/870.02 |
| 5,774,660 A | 6/1998 | Brendel et al. | 709/201 |
| 5,812,531 A | 9/1998 | Cheung et al. | 370/255 |
| 5,822,309 A | 10/1998 | Ayanoglu et al. | 370/315 |
| 5,844,893 A | 12/1998 | Gollnick et al. | 370/329 |
| 5,874,903 A | 2/1999 | Shuey et al. | 340/870.02 |
| 5,880,677 A | 3/1999 | Lestician | 340/825.06 |
| 5,892,758 A | 4/1999 | Argyroudis | 370/335 |
| 5,894,422 A | 4/1999 | Chasek | 364/528.26 |
| 5,896,097 A | 4/1999 | Cardozo | 340/870.03 |
| 5,898,387 A | 4/1999 | Davis et al. | 340/870.02 |
| 5,898,826 A | 4/1999 | Pierce et al. | 714/4 |
| 5,901,067 A | 5/1999 | Kao et al. | 700/11 |
| 5,903,566 A | 5/1999 | Flammer, III | 370/406 |
| 5,914,672 A | 6/1999 | Glorioso et al. | 340/870.02 |
| 5,914,673 A | 6/1999 | Jennings et al. | 340/870.02 |
| 5,920,697 A | 7/1999 | Masters et al. | 709/219 |
| 5,926,531 A | 7/1999 | Petite | 379/144.04 |
| 5,933,092 A | 8/1999 | Ouellette et al. | 340/870.02 |
| 5,953,371 A | 9/1999 | Rowsell et al. | 375/220 |
| 5,963,146 A | 10/1999 | Johnson et al. | 340/870.01 |
| 5,963,457 A | 10/1999 | Kanoi et al. | 364/528.26 |
| 5,974,236 A | 10/1999 | Sherman | 709/221 |
| 5,986,574 A | 11/1999 | Colton | 340/870.02 |
| 5,987,011 A | 11/1999 | Toh | 370/331 |
| 5,991,806 A | 11/1999 | McHann, Jr. | 709/224 |
| 6,014,089 A | 1/2000 | Tracy et al. | 340/870.02 |
| 6,018,659 A | 1/2000 | Ayyagari et al. | 455/431 |
| 6,026,133 A | 2/2000 | Sokoler | 375/365 |
| 6,028,522 A | 2/2000 | Petite | 340/641 |
| 6,044,062 A | 3/2000 | Brownrigg et al. | 370/238 |
| 6,058,355 A | 5/2000 | Ahmed et al. | 702/62 |
| 6,061,609 A | 5/2000 | Kanoi et al. | 700/291 |
| 6,073,169 A | 6/2000 | Shuey et al. | 709/217 |
| 6,075,777 A | 6/2000 | Agrawal et al. | 370/329 |
| 6,078,785 A | 6/2000 | Bush | 455/7 |
| 6,084,867 A | 7/2000 | Meier | 370/338 |
| 6,088,659 A | 7/2000 | Kelley et al. | 702/62 |
| 6,097,703 A | 8/2000 | Larsen et al. | 370/254 |
| 6,108,699 A | 8/2000 | Moiin | 709/221 |
| 6,118,269 A | 9/2000 | Davis | 324/110 |
| 6,122,603 A | 9/2000 | Budike, Jr. | 702/182 |
| 6,124,806 A | 9/2000 | Cunningham et al. | 340/870.02 |
| 6,134,587 A | 10/2000 | Okanoue | 709/222 |
| 6,137,423 A | 10/2000 | Glorioso et al. | 340/870.02 |
| 6,150,955 A | 11/2000 | Tracy et al. | 340/870.02 |
| 6,169,979 B1 | 1/2001 | Johnson | 705/412 |
| 6,172,616 B1 | 1/2001 | Johnson et al. | 340/870.12 |
| 6,195,018 B1 | 2/2001 | Ragle et al. | 340/870.01 |
| 6,218,953 B1 | 4/2001 | Petite | 340/641 |
| 6,233,327 B1 | 5/2001 | Petite | 379/155 |
| 6,239,722 B1 | 5/2001 | Colton et al. | 340/870.02 |
| 6,240,080 B1 | 5/2001 | Okanoue et al. | 370/338 |
| 6,246,677 B1 | 6/2001 | Nap et al. | 370/346 |
| 6,246,689 B1 | 6/2001 | Shavitt | 370/406 |
| 6,249,516 B1 | 6/2001 | Brownrigg et al. | 370/338 |
| 6,298,053 B1 | 10/2001 | Flammer, III et al. | 370/349 |
| 6,300,881 B1 | 10/2001 | Yee et al. | 340/870.02 |
| 6,304,556 B1 | 10/2001 | Haas | 370/254 |
| 6,311,105 B1 | 10/2001 | Budike, Jr. | 700/291 |
| 6,338,087 B1 | 1/2002 | Okanoue | 709/222 |
| 6,362,745 B1 | 3/2002 | Davis | 340/637 |
| 6,363,057 B1 | 3/2002 | Ardalan et al. | 370/252 |
| 6,366,217 B1 | 4/2002 | Cunningham et al. | 340/870.31 |
| 6,369,719 B1 | 4/2002 | Tracy et al. | 340/870.02 |
| 6,369,769 B1 | 4/2002 | Nap et al. | 343/719 |
| 6,373,399 B1 | 4/2002 | Johnson et al. | 340/870.11 |
| 6,396,839 B1 | 5/2002 | Ardalan et al. | 370/401 |
| 6,400,949 B1 | 6/2002 | Bielefeld et al. | 455/434 |
| 6,407,991 B1 | 6/2002 | Meier | 370/338 |
| 6,415,330 B1 | 7/2002 | Okanoue | 709/245 |
| 6,430,268 B1 | 8/2002 | Petite | 379/39 |
| 6,437,692 B1 | 8/2002 | Petite et al. | 340/540 |
| 6,457,054 B1 | 9/2002 | Bakshi | 709/227 |
| 6,480,497 B1 | 11/2002 | Flammer, III et al. | 370/400 |
| 6,480,505 B1 | 11/2002 | Johansson et al. | 370/449 |
| 6,492,910 B1 | 12/2002 | Ragle et al. | 340/870.02 |
| 6,509,841 B1 | 1/2003 | Colton et al. | 340/870.11 |
| 6,522,974 B2 | 2/2003 | Sitton | 702/17 |
| 6,535,498 B1 | 3/2003 | Larsson et al. | 370/338 |
| 6,538,577 B1 | 3/2003 | Ehrke et al. | 340/870.02 |
| 6,553,355 B1 | 4/2003 | Arnoux et al. | 706/13 |
| 6,577,671 B1 | 6/2003 | Vimpari | 375/146 |
| 6,606,708 B1 | 8/2003 | Devine et al. | 726/8 |
| 6,618,578 B1 | 9/2003 | Petite | 455/92 |
| 6,618,772 B1 | 9/2003 | Kao et al. | 710/15 |
| 6,628,764 B1 | 9/2003 | Petite | 379/106.01 |
| 6,633,823 B2 | 10/2003 | Bartone et al. | 702/57 |
| 6,636,894 B1 | 10/2003 | Short et al. | 709/225 |
| 6,650,249 B2 | 11/2003 | Meyer et al. | 340/870.28 |
| 6,653,945 B2 | 11/2003 | Johnson et al. | 340/870.02 |
| 6,657,552 B2 | 12/2003 | Belski et al. | 340/870.02 |
| 6,665,620 B1 | 12/2003 | Burns et al. | 702/62 |
| 6,671,635 B1 | 12/2003 | Forth et al. | 702/61 |
| 6,675,071 B1 | 1/2004 | Griffin, Jr. et al. | 700/286 |
| 6,681,110 B1 | 1/2004 | Crookham et al. | 455/420 |
| 6,681,154 B2 | 1/2004 | Nierlich et al. | 700/286 |
| 6,684,245 B1 | 1/2004 | Shuey et al. | 709/223 |
| 6,691,173 B2 | 2/2004 | Morris et al. | 709/249 |
| 6,697,331 B1 | 2/2004 | Riihinen et al. | 370/236 |
| 6,710,721 B1 | 3/2004 | Holowick | 340/870.02 |
| 6,711,166 B1 | 3/2004 | Amir et al. | 370/395.1 |
| 6,711,409 B1 | 3/2004 | Zavgren, Jr. et al. | 455/445 |
| 6,714,787 B2 | 3/2004 | Reed et al. | 455/445 |
| 6,718,137 B1 | 4/2004 | Chin | 398/3 |
| 6,725,281 B1 | 4/2004 | Zintel et al. | 719/318 |

(56) References Cited

U.S. PATENT DOCUMENTS

| | | |
|---|---|---|
| 6,728,514 B2 | 4/2004 | Bandeira et al. ............... 455/13.1 |
| 6,747,557 B1 | 6/2004 | Petite et al. ..................... 340/540 |
| 6,747,981 B2 | 6/2004 | Ardalan et al. ................. 370/401 |
| 6,751,445 B2 | 6/2004 | Kasperkovitz et al. ........... 455/76 |
| 6,751,455 B1 | 6/2004 | Acampora ................... 455/414.1 |
| 6,751,672 B1 | 6/2004 | Khalil et al. .................... 709/230 |
| 6,772,052 B1 | 8/2004 | Amundsen et al. ............. 700/291 |
| 6,775,258 B1 | 8/2004 | van Valkenburg et al. ..... 370/338 |
| 6,778,099 B1 | 8/2004 | Mayer et al. ............... 340/870.02 |
| 6,785,592 B1 | 8/2004 | Smith et al. .................... 700/291 |
| 6,798,352 B2 | 9/2004 | Holowick .................. 340/870.02 |
| 6,801,865 B2 | 10/2004 | Gilgenbach et al. .............. 702/61 |
| 6,826,620 B1 | 11/2004 | Mawhinney et al. ........... 709/235 |
| 6,829,216 B1 | 12/2004 | Nakata ........................... 370/228 |
| 6,829,347 B1 | 12/2004 | Odiaka ...................... 379/220.01 |
| 6,831,921 B2 | 12/2004 | Higgins .......................... 370/401 |
| 6,836,737 B2 | 12/2004 | Petite et al. ...................... 702/62 |
| 6,839,775 B1 | 1/2005 | Kao et al. ........................ 710/15 |
| 6,842,706 B1 | 1/2005 | Baraty ............................. 702/61 |
| 6,845,091 B2 | 1/2005 | Ogier et al. .................... 370/338 |
| 6,859,186 B2 | 2/2005 | Lizalek et al. .................. 343/767 |
| 6,865,185 B1 | 3/2005 | Patel et al. ..................... 370/412 |
| 6,885,309 B1 | 4/2005 | Van Heteren ............... 340/870.11 |
| 6,891,838 B1 | 5/2005 | Petite et al. .................... 370/401 |
| 6,900,738 B2 | 5/2005 | Crichlow .................... 340/870.02 |
| 6,904,025 B1 | 6/2005 | Madour et al. ................. 370/328 |
| 6,904,385 B1 | 6/2005 | Budike, Jr. ..................... 702/182 |
| 6,909,705 B1 | 6/2005 | Lee et al. ........................ 370/338 |
| 6,914,533 B2 | 7/2005 | Petite ............................. 340/628 |
| 6,914,893 B2 | 7/2005 | Petite ............................. 370/338 |
| 6,946,972 B2 | 9/2005 | Mueller et al. ............ 340/870.02 |
| 6,954,814 B1 | 10/2005 | Leach ............................. 710/305 |
| 6,963,285 B2 | 11/2005 | Fischer et al. .................. 340/635 |
| 6,967,452 B2 | 11/2005 | Aiso et al. ...................... 318/466 |
| 6,970,434 B1 | 11/2005 | Mahany et al. ................. 370/256 |
| 6,970,771 B1 | 11/2005 | Preiss et al. .................... 700/286 |
| 6,975,613 B1 | 12/2005 | Johansson ...................... 370/338 |
| 6,980,973 B1 | 12/2005 | Karpenko ....................... 705/412 |
| 6,982,651 B2 | 1/2006 | Fischer ....................... 340/870.02 |
| 6,985,087 B2 | 1/2006 | Soliman ..................... 340/870.02 |
| 6,995,666 B1 | 2/2006 | Luttrell ....................... 340/539.1 |
| 6,999,441 B2 | 2/2006 | Flammer, III et al. ......... 370/337 |
| 7,009,379 B2 | 3/2006 | Ramirez ......................... 324/142 |
| 7,009,493 B2 | 3/2006 | Howard et al. .................. 340/7.1 |
| 7,010,363 B2 | 3/2006 | Donnelly et al. ................ 700/19 |
| 7,016,336 B2 | 3/2006 | Sörensen ........................ 370/351 |
| 7,020,701 B1 | 3/2006 | Gelvin et al. ................... 709/224 |
| 7,042,368 B2 | 5/2006 | Patterson et al. ........... 340/870.29 |
| 7,046,682 B2 | 5/2006 | Carpenter et al. .............. 370/401 |
| 7,053,767 B2 | 5/2006 | Petite et al. ..................... 340/531 |
| 7,054,271 B2 | 5/2006 | Brownrigg et al. ............ 370/238 |
| 7,062,361 B1 | 6/2006 | Lane ............................... 700/295 |
| 7,064,679 B2 | 6/2006 | Ehrke et al. ............... 340/870.02 |
| 7,072,945 B1 | 7/2006 | Nieminen et al. .............. 709/217 |
| 7,079,810 B2 | 7/2006 | Petite et al. ..................... 455/41.2 |
| 7,089,089 B2 | 8/2006 | Cumming et al. .............. 700/295 |
| 7,102,533 B2 | 9/2006 | Kim ........................... 340/870.02 |
| 7,103,511 B2 | 9/2006 | Petite ............................. 702/188 |
| 7,106,044 B1 | 9/2006 | Lee, Jr. et al. .................. 324/110 |
| 7,119,713 B2 | 10/2006 | Shuey et al. ................ 340/870.02 |
| 7,126,494 B2 | 10/2006 | Ardalan et al. ............ 340/870.02 |
| 7,135,850 B2 | 11/2006 | Ramirez ......................... 324/142 |
| 7,135,956 B2 | 11/2006 | Bartone et al. ................... 340/3.9 |
| 7,137,550 B1 | 11/2006 | Petite ............................. 235/382 |
| 7,143,204 B1 | 11/2006 | Kao et al. ........................ 710/18 |
| 7,145,474 B2 | 12/2006 | Shuey et al. ................ 340/870.03 |
| 7,170,425 B2 | 1/2007 | Christopher et al. ...... 340/870.02 |
| 7,185,131 B2 | 2/2007 | Leach ............................. 710/305 |
| 7,188,003 B2 | 3/2007 | Ransom et al. ................. 700/286 |
| 7,197,046 B1 | 3/2007 | Hariharasubrahmanian . 370/466 |
| 7,200,633 B2 | 4/2007 | Sekiguchi et al. .............. 709/203 |
| 7,209,840 B2 | 4/2007 | Petite et al. ...................... 702/62 |
| 7,215,926 B2 | 5/2007 | Corbett et al. .................. 455/41.2 |
| 7,222,111 B1 | 5/2007 | Budike, Jr. ..................... 705/412 |
| 7,230,544 B2 | 6/2007 | Van Heteren ............... 340/870.03 |
| 7,231,482 B2 | 6/2007 | Leach ............................. 710/305 |
| 7,248,181 B2 | 7/2007 | Patterson et al. ........... 340/870.03 |
| 7,248,861 B2 | 7/2007 | Lazaridis et al. .............. 455/414.1 |
| 7,250,874 B2 | 7/2007 | Mueller et al. ............ 340/870.06 |
| 7,251,570 B2 | 7/2007 | Hancock et al. ................. 702/57 |
| 7,263,073 B2 | 8/2007 | Petite et al. ..................... 370/278 |
| 7,271,735 B2 | 9/2007 | Rogai ........................ 340/870.02 |
| 7,274,305 B1 | 9/2007 | Luttrell ...................... 340/870.02 |
| 7,274,975 B2 | 9/2007 | Miller ............................. 700/295 |
| 7,277,027 B2 | 10/2007 | Ehrke et al. ............... 340/870.12 |
| 7,277,967 B2 | 10/2007 | Kao et al. ........................ 710/18 |
| 7,289,887 B2 | 10/2007 | Rodgers ......................... 700/295 |
| 7,295,128 B2 | 11/2007 | Petite ............................. 340/628 |
| 7,301,476 B2 | 11/2007 | Shuey et al. ................ 340/870.03 |
| 7,304,587 B2 | 12/2007 | Boaz .......................... 340/870.02 |
| 7,308,370 B2 | 12/2007 | Mason, Jr. et al. ............... 702/65 |
| 7,312,721 B2 | 12/2007 | Mason, Jr. et al. .......... 340/870.02 |
| 7,315,257 B2 | 1/2008 | Patterson et al. ........... 340/870.02 |
| 7,317,404 B2 | 1/2008 | Cumeralto et al. ........ 340/870.02 |
| 7,321,316 B2 | 1/2008 | Hancock et al. ........... 340/870.02 |
| 7,324,453 B2 | 1/2008 | Wu et al. ........................ 370/238 |
| 7,327,998 B2 | 2/2008 | Kumar et al. ................... 455/405 |
| 7,346,463 B2 | 3/2008 | Petite et al. ...................... 702/62 |
| 7,348,769 B2 | 3/2008 | Ramirez ....................... 324/158.1 |
| 7,349,766 B2 | 3/2008 | Rodgers ......................... 700/295 |
| 7,362,709 B1 | 4/2008 | Hui et al. ........................ 370/237 |
| 7,366,113 B1 | 4/2008 | Chandra et al. ................ 370/255 |
| 7,379,981 B2 | 5/2008 | Elliott et al. .................... 709/220 |
| 7,397,907 B2 | 7/2008 | Petite ............................. 379/155 |
| 7,406,298 B2 | 7/2008 | Luglio et al. ................... 455/90.3 |
| 7,411,964 B2 | 8/2008 | Suemura ........................ 370/400 |
| 7,427,927 B2 | 9/2008 | Borleske et al. ........... 340/870.02 |
| 7,451,019 B2 | 11/2008 | Rodgers ......................... 700/295 |
| 7,457,273 B2 | 11/2008 | Nakanishi et al. ............. 370/338 |
| 7,468,661 B2 | 12/2008 | Petite et al. ..................... 340/540 |
| 7,487,282 B2 | 2/2009 | Leach ............................. 710/305 |
| 7,495,578 B2 | 2/2009 | Borleske .................... 340/870.02 |
| 7,498,873 B2 | 3/2009 | Opshaug et al. ............... 329/315 |
| 7,505,453 B2 | 3/2009 | Carpenter et al. .............. 370/352 |
| 7,512,234 B2 | 3/2009 | McDonnell et al. ........... 380/247 |
| 7,515,571 B2 | 4/2009 | Kwon et al. .................... 370/338 |
| 7,516,106 B2 | 4/2009 | Ehlers et al. .................... 705/412 |
| 7,522,540 B1 | 4/2009 | Maufer ........................... 370/254 |
| 7,522,639 B1 | 4/2009 | Katz ............................... 370/503 |
| 7,539,151 B2 | 5/2009 | Demirhan et al. ............. 370/254 |
| 7,545,285 B2 | 6/2009 | Shuey et al. ................ 340/870.02 |
| 7,548,826 B2 | 6/2009 | Witter et al. .................... 702/115 |
| 7,548,907 B2 | 6/2009 | Wall et al. ............................ 1/1 |
| 7,554,941 B2 | 6/2009 | Ratiu et al. ..................... 370/328 |
| 7,562,024 B2 | 7/2009 | Brooks et al. ................... 705/1.1 |
| 7,586,420 B2 | 9/2009 | Fischer et al. .................. 340/635 |
| 7,599,665 B2 | 10/2009 | Sinivaara ..................... 455/67.16 |
| 7,602,747 B2 | 10/2009 | Maksymczuk et al. ........ 370/331 |
| 7,609,673 B2 | 10/2009 | Bergenlid et al. .............. 370/329 |
| 7,613,147 B2 | 11/2009 | Bergenlid et al. .............. 370/329 |
| 7,623,043 B2 | 11/2009 | Mizra et al. ............... 340/870.02 |
| 7,626,967 B2 | 12/2009 | Yarvis et al. .................... 370/338 |
| 7,650,425 B2 | 1/2010 | Davis et al. ..................... 709/238 |
| 7,676,231 B2 | 3/2010 | Demirhan et al. ............. 455/452.1 |
| 7,680,041 B2 | 3/2010 | Johansen ........................ 370/230 |
| 7,729,496 B2 | 6/2010 | Hacigumus ..................... 380/277 |
| 7,756,538 B2 | 7/2010 | Bonta et al. .................... 455/517 |
| 7,814,322 B2 | 10/2010 | Gurevich et al. ............... 713/171 |
| 7,847,706 B1 | 12/2010 | Ross et al. .................... 340/12.52 |
| 2001/0005368 A1 | 6/2001 | Rune ............................. 370/390 |
| 2001/0038342 A1 | 11/2001 | Foote ........................ 340/870.02 |
| 2001/0046879 A1 | 11/2001 | Schramm et al. .............. 455/525 |
| 2002/0012358 A1 | 1/2002 | Sato ................................ 370/466 |
| 2002/0013679 A1 | 1/2002 | Petite ............................. 702/188 |
| 2002/0031101 A1 | 3/2002 | Petite et al. ..................... 370/310 |
| 2002/0066095 A1 | 5/2002 | Yu ................................... 717/173 |
| 2002/0110118 A1 | 8/2002 | Foley ............................. 370/352 |
| 2002/0120569 A1 | 8/2002 | Day ................................. 705/40 |
| 2002/0174354 A1 | 11/2002 | Bel et al. ........................ 713/193 |
| 2002/0186619 A1 | 12/2002 | Reeves et al. ................... 368/47 |
| 2003/0001640 A1 | 1/2003 | Lao et al. ........................ 327/165 |
| 2003/0001754 A1 | 1/2003 | Johnson et al. ........... 340/870.02 |
| 2003/0033394 A1 | 2/2003 | Stine .............................. 709/222 |
| 2003/0037268 A1 | 2/2003 | Kistler ............................ 713/310 |

(56) References Cited

U.S. PATENT DOCUMENTS

| | | | |
|---|---|---|---|
| 2003/0050737 A1 | 3/2003 | Osann | 700/276 |
| 2003/0112822 A1 | 6/2003 | Hong et al. | 370/469 |
| 2003/0117966 A1 | 6/2003 | Chen | 370/255 |
| 2003/0122686 A1 | 7/2003 | Ehrke et al. | 340/870.02 |
| 2003/0123481 A1 | 7/2003 | Neale et al. | 370/466 |
| 2003/0156715 A1 | 8/2003 | Reeds, III et al. | 380/37 |
| 2003/0229900 A1 | 12/2003 | Reisman | 725/87 |
| 2003/0233201 A1 | 12/2003 | Horst et al. | 702/62 |
| 2004/0008663 A1 | 1/2004 | Srikrishna et al. | 370/351 |
| 2004/0031030 A1 | 2/2004 | Kidder et al. | 717/172 |
| 2004/0034773 A1 | 2/2004 | Balabine et al. | 713/168 |
| 2004/0056775 A1 | 3/2004 | Crookham et al. | 340/825 |
| 2004/0066310 A1 | 4/2004 | Ehrke et al. | 340/870.02 |
| 2004/0077341 A1 | 4/2004 | Chandranmenon et al. | 455/418 |
| 2004/0082203 A1 | 4/2004 | Logvinov et al. | 439/10 |
| 2004/0100953 A1 | 5/2004 | Chen et al. | 370/389 |
| 2004/0113810 A1 | 6/2004 | Mason, Jr. et al. | 340/870.02 |
| 2004/0117788 A1 | 6/2004 | Karaoguz et al. | 717/177 |
| 2004/0125776 A1 | 7/2004 | Haugli et al. | 370/338 |
| 2004/0138787 A1 | 7/2004 | Ransom et al. | 700/295 |
| 2004/0140908 A1 | 7/2004 | Gladwin et al. | 340/870.02 |
| 2004/0157613 A1 | 8/2004 | Steer et al. | 455/446 |
| 2004/0183687 A1 | 9/2004 | Petite et al. | 340/601 |
| 2004/0185845 A1 | 9/2004 | Abhishek et al. | 455/422.1 |
| 2004/0210544 A1 | 10/2004 | Shuey et al. | 705/412 |
| 2005/0026569 A1 | 2/2005 | Lim et al. | 455/73 |
| 2005/0027859 A1 | 2/2005 | Alvisi et al. | 709/224 |
| 2005/0030968 A1 | 2/2005 | Rich et al. | 370/449 |
| 2005/0033967 A1 | 2/2005 | Morino et al. | 713/182 |
| 2005/0055432 A1 | 3/2005 | Rodgers | 709/223 |
| 2005/0058144 A1 | 3/2005 | Ayyagari et al. | 370/401 |
| 2005/0065742 A1 | 3/2005 | Rodgers | 702/62 |
| 2005/0122944 A1 | 6/2005 | Kwon et al. | 370/338 |
| 2005/0136972 A1 | 6/2005 | Smith et al. | 455/554.1 |
| 2005/0172024 A1 | 8/2005 | Cheifot et al. | 709/225 |
| 2005/0201397 A1 | 9/2005 | Petite | 370/401 |
| 2005/0243867 A1 | 11/2005 | Petite | 370/474 |
| 2005/0251403 A1 | 11/2005 | Shuey | 705/1 |
| 2005/0257215 A1 | 11/2005 | Denby et al. | 717/172 |
| 2005/0270173 A1 | 12/2005 | Boaz | 340/870.02 |
| 2005/0276243 A1 | 12/2005 | Sugaya et al. | 370/328 |
| 2005/0286440 A1 | 12/2005 | Strutt et al. | 370/253 |
| 2006/0028355 A1 | 2/2006 | Patterson et al. | 340/870.02 |
| 2006/0055432 A1 | 3/2006 | Shimokawa et al. | 327/5 |
| 2006/0056363 A1 | 3/2006 | Ratiu et al. | 370/338 |
| 2006/0056368 A1 | 3/2006 | Ratiu et al. | 370/338 |
| 2006/0077906 A1 | 4/2006 | Maegawa et al. | 370/254 |
| 2006/0087993 A1 | 4/2006 | Sengupta et al. | 370/310 |
| 2006/0098576 A1 | 5/2006 | Brownrigg et al. | 370/238 |
| 2006/0098604 A1 | 5/2006 | Flammer, III et al. | 370/337 |
| 2006/0111111 A1 | 5/2006 | Ovadia | 455/439 |
| 2006/0140135 A1 | 6/2006 | Bonta et al. | 370/254 |
| 2006/0146717 A1 | 7/2006 | Conner et al. | 370/238 |
| 2006/0158347 A1 | 7/2006 | Roche et al. | 340/870.02 |
| 2006/0161310 A1 | 7/2006 | Lal | 700/295 |
| 2006/0167784 A1 | 7/2006 | Hoffberg | 705/37 |
| 2006/0184288 A1 | 8/2006 | Rodgers | 700/295 |
| 2006/0215583 A1 | 9/2006 | Castagnoli | 370/254 |
| 2006/0215673 A1 | 9/2006 | Olvera-Hernandez | 370/406 |
| 2006/0217936 A1 | 9/2006 | Mason et al. | 702/188 |
| 2006/0230276 A1 | 10/2006 | Nochta | 713/176 |
| 2006/0271244 A1 | 11/2006 | Cumming et al. | 700/291 |
| 2006/0271678 A1 | 11/2006 | Jessup et al. | 709/224 |
| 2007/0001868 A1 | 1/2007 | Boaz | 340/870.02 |
| 2007/0013547 A1 | 1/2007 | Boaz | 340/870.02 |
| 2007/0019598 A1 | 1/2007 | Prehofer | 370/338 |
| 2007/0036353 A1 | 2/2007 | Reznik et al. | 380/30 |
| 2007/0057767 A1 | 3/2007 | Sun et al. | 340/7.35 |
| 2007/0060147 A1 | 3/2007 | Shin et al. | 455/445 |
| 2007/0063868 A1 | 3/2007 | Borleske | 340/870.03 |
| 2007/0085700 A1 | 4/2007 | Walters et al. | 340/870.02 |
| 2007/0087756 A1 | 4/2007 | Hoffberg | 455/450 |
| 2007/0103324 A1 | 5/2007 | Kosuge et al. | 340/618 |
| 2007/0109121 A1 | 5/2007 | Cohen | 340/539.26 |
| 2007/0110024 A1 | 5/2007 | Meier | 370/351 |
| 2007/0120705 A1 | 5/2007 | Kiiskila et al. | 340/870.02 |
| 2007/0136817 A1 | 6/2007 | Nguyen | 726/26 |
| 2007/0139220 A1 | 6/2007 | Mirza et al. | 340/870.02 |
| 2007/0143046 A1 | 6/2007 | Budike | 702/62 |
| 2007/0147268 A1 | 6/2007 | Kelley et al. | 370/254 |
| 2007/0169074 A1 | 7/2007 | Koo et al. | 717/168 |
| 2007/0169075 A1 | 7/2007 | Lill et al. | 717/168 |
| 2007/0169080 A1 | 7/2007 | Friedman | 717/168 |
| 2007/0177538 A1 | 8/2007 | Christensen et al. | 370/328 |
| 2007/0177576 A1 | 8/2007 | Johansen et al. | 370/351 |
| 2007/0177613 A1 | 8/2007 | Shorty et al. | 370/401 |
| 2007/0189249 A1 | 8/2007 | Gurevich et al. | 370/338 |
| 2007/0200729 A1 | 8/2007 | Borleske et al. | 340/870.02 |
| 2007/0201504 A1 | 8/2007 | Christensen et al. | 370/437 |
| 2007/0204009 A1 | 8/2007 | Shorty et al. | 709/218 |
| 2007/0205915 A1 | 9/2007 | Shuey et al. | 340/870.02 |
| 2007/0206503 A1 | 9/2007 | Gong et al. | 370/238 |
| 2007/0206521 A1 | 9/2007 | Osaje | 370/315 |
| 2007/0207811 A1 | 9/2007 | Das et al. | 455/450 |
| 2007/0210933 A1 | 9/2007 | Leach | 340/870.02 |
| 2007/0211636 A1 | 9/2007 | Bellur et al. | 370/238 |
| 2007/0239477 A1 | 10/2007 | Budike, Jr. | 705/412 |
| 2007/0248047 A1 | 10/2007 | Shorty et al. | 370/329 |
| 2007/0257813 A1 | 11/2007 | Vaswani et al. | 340/870.02 |
| 2007/0258508 A1 | 11/2007 | Werb et al. | 375/140 |
| 2007/0263647 A1 | 11/2007 | Shorty et al. | 370/406 |
| 2007/0265947 A1 | 11/2007 | Schimpf et al. | 705/35 |
| 2007/0266429 A1 | 11/2007 | Ginter et al. | 726/12 |
| 2007/0271006 A1 | 11/2007 | Golden et al. | 700/295 |
| 2007/0276547 A1 | 11/2007 | Miller | 700/295 |
| 2008/0018492 A1 | 1/2008 | Ehrke et al. | 340/870.03 |
| 2008/0024320 A1 | 1/2008 | Ehrke et al. | 340/870.02 |
| 2008/0031145 A1 | 2/2008 | Ethier et al. | 370/248 |
| 2008/0032703 A1 | 2/2008 | Krumm et al. | 455/456.1 |
| 2008/0037569 A1 | 2/2008 | Werb et al. | 370/406 |
| 2008/0042874 A1 | 2/2008 | Rogai | 340/870.03 |
| 2008/0046388 A1 | 2/2008 | Budike, Jr. | 705/412 |
| 2008/0048883 A1 | 2/2008 | Boaz | 340/870.02 |
| 2008/0051036 A1 | 2/2008 | Vaswani et al. | 455/69 |
| 2008/0063205 A1 | 3/2008 | Braskich et al. | 380/270 |
| 2008/0068217 A1 | 3/2008 | Van Wyk et al. | 340/870.11 |
| 2008/0068994 A1 | 3/2008 | Garrison Stuber et al. | 370/230 |
| 2008/0068996 A1 | 3/2008 | Clave et al. | 370/230.1 |
| 2008/0086560 A1 | 4/2008 | Monier et al. | 709/224 |
| 2008/0089314 A1 | 4/2008 | Meyer et al. | 370/349 |
| 2008/0095221 A1 | 4/2008 | Picard | 375/224 |
| 2008/0097782 A1 | 4/2008 | Budike, Jr. | 705/1.1 |
| 2008/0107034 A1 | 5/2008 | Jetcheva et al. | 370/238 |
| 2008/0117110 A1 | 5/2008 | Luglio et al. | 343/702 |
| 2008/0129538 A1 | 6/2008 | Vaswani et al. | 340/870.03 |
| 2008/0130535 A1 | 6/2008 | Shorty et al. | 370/310 |
| 2008/0130562 A1 | 6/2008 | Shorty et al. | 370/329 |
| 2008/0132185 A1 | 6/2008 | Elliott et al. | 455/115.4 |
| 2008/0136667 A1 | 6/2008 | Vaswani et al. | 340/870.02 |
| 2008/0151795 A1 | 6/2008 | Shorty et al. | 370/310 |
| 2008/0151824 A1 | 6/2008 | Shorty et al. | 370/329 |
| 2008/0151825 A1 | 6/2008 | Shorty et al. | 370/329 |
| 2008/0151826 A1 | 6/2008 | Shorty et al. | 370/329 |
| 2008/0151827 A1 | 6/2008 | Shorty et al. | 370/329 |
| 2008/0154396 A1 | 6/2008 | Shorty et al. | 700/90 |
| 2008/0159213 A1 | 7/2008 | Shorty et al. | 370/329 |
| 2008/0165712 A1 | 7/2008 | Shorty et al. | 370/310 |
| 2008/0170511 A1 | 7/2008 | Shorty et al. | 370/254 |
| 2008/0177678 A1 | 7/2008 | Di Martini et al. | 705/512 |
| 2008/0180274 A1 | 7/2008 | Cumeralto et al. | 340/870.02 |
| 2008/0181133 A1 | 7/2008 | Thubert et al. | 370/255 |
| 2008/0183339 A1 | 7/2008 | Vaswani et al. | 700/297 |
| 2008/0186202 A1 | 8/2008 | Vaswani et al. | 340/870.03 |
| 2008/0186203 A1 | 8/2008 | Vaswani et al. | 340/870.11 |
| 2008/0187001 A1 | 8/2008 | Vaswani et al. | 370/466 |
| 2008/0187116 A1 | 8/2008 | Reeves et al. | 379/106.09 |
| 2008/0189415 A1 | 8/2008 | Vaswani et al. | 709/226 |
| 2008/0189436 A1 | 8/2008 | Vaswani et al. | 709/242 |
| 2008/0204272 A1 | 8/2008 | Ehrke et al. | 340/870.02 |
| 2008/0205355 A1 | 8/2008 | Liu et al. | 370/338 |
| 2008/0224891 A1 | 9/2008 | Ehrke et al. | 340/870.02 |
| 2008/0225737 A1 | 9/2008 | Gong et al. | 370/252 |
| 2008/0238714 A1 | 10/2008 | Ehrke et al. | 340/870.02 |
| 2008/0238716 A1 | 10/2008 | Ehrke et al. | 340/870.03 |

(56) References Cited

U.S. PATENT DOCUMENTS

| | | | |
|---|---|---|---|
| 2008/0272934 A1 | 11/2008 | Wang et al. | 340/870.11 |
| 2008/0310311 A1 | 12/2008 | Flammer et al. | 370/238 |
| 2008/0310377 A1 | 12/2008 | Flammer et al. | 370/338 |
| 2008/0317047 A1 | 12/2008 | Zeng et al. | 370/401 |
| 2009/0003214 A1 | 1/2009 | Vaswani et al. | 370/236 |
| 2009/0003232 A1 | 1/2009 | Vaswani et al. | 370/252 |
| 2009/0003243 A1 | 1/2009 | Vaswani et al. | 370/255 |
| 2009/0003356 A1 | 1/2009 | Vaswani et al. | 370/400 |
| 2009/0010178 A1 | 1/2009 | Tekippe | 370/254 |
| 2009/0034418 A1 | 2/2009 | Flammer, III et al. | 370/238 |
| 2009/0034419 A1 | 2/2009 | Flammer, III et al. | 370/238 |
| 2009/0034432 A1 | 2/2009 | Bonta et al. | 370/255 |
| 2009/0043911 A1 | 2/2009 | Flammer et al. | 709/238 |
| 2009/0046732 A1 | 2/2009 | Pratt, Jr. et al. | 370/406 |
| 2009/0055032 A1 | 2/2009 | Rodgers | 700/295 |
| 2009/0068947 A1 | 3/2009 | Petite | 455/462 |
| 2009/0077405 A1 | 3/2009 | Johansen | 713/323 |
| 2009/0079584 A1 | 3/2009 | Grady et al. | 340/870.02 |
| 2009/0082888 A1 | 3/2009 | Johansen | 700/94 |
| 2009/0096605 A1 | 4/2009 | Petite et al. | 340/539.22 |
| 2009/0102737 A1 | 4/2009 | Birnbaum et al. | 343/828 |
| 2009/0115626 A1 | 5/2009 | Vaswani et al. | 340/870.02 |
| 2009/0134969 A1 | 5/2009 | Veillette | 340/3.1 |
| 2009/0135716 A1 | 5/2009 | Veillette | 370/221 |
| 2009/0135843 A1 | 5/2009 | Veillette | 370/406 |
| 2009/0161594 A1 | 6/2009 | Zhu et al. | 370/312 |
| 2009/0167547 A1 | 7/2009 | Gilbert | 340/662 |
| 2009/0168846 A1 | 7/2009 | Filippo, III et al. | 375/133 |
| 2009/0175238 A1 | 7/2009 | Jetcheva et al. | 370/329 |
| 2009/0179771 A1 | 7/2009 | Seal et al. | 340/870.04 |
| 2009/0235246 A1 | 9/2009 | Seal et al. | 717/173 |
| 2009/0243840 A1 | 10/2009 | Petite et al. | 340/539.1 |
| 2009/0245270 A1 | 10/2009 | van Greunen et al. | 370/410 |
| 2009/0262642 A1 | 10/2009 | van Greunen et al. | 370/216 |
| 2009/0267792 A1 | 10/2009 | Crichlow | 340/870.02 |
| 2009/0285124 A1 | 11/2009 | Aguirre et al. | 370/255 |
| 2009/0303972 A1 | 12/2009 | Flammer, III et al. | 370/338 |
| 2009/0315699 A1 | 12/2009 | Satish et al. | 340/533 |
| 2009/0319672 A1 | 12/2009 | Reisman | 709/227 |
| 2009/0320073 A1 | 12/2009 | Reisman | 725/51 |
| 2010/0007336 A1 | 1/2010 | de Buda | 324/127 |
| 2010/0037069 A1 | 2/2010 | Deierling et al. | 713/193 |
| 2010/0037293 A1 | 2/2010 | St. Johns et al. | 726/2 |
| 2010/0040042 A1 | 2/2010 | van Greunen et al. | 370/350 |
| 2010/0060259 A1 | 3/2010 | Vaswani et al. | 324/86 |
| 2010/0061350 A1 | 3/2010 | Flammer, III | 370/338 |
| 2010/0073193 A1 | 3/2010 | Flammer, III | 340/870.11 |
| 2010/0074176 A1 | 3/2010 | Flammer, III et al. | 370/328 |
| 2010/0102824 A1 | 4/2010 | Tremblay et al. | 324/522 |
| 2010/0179780 A1 | 7/2010 | Taft | 702/64 |

FOREIGN PATENT DOCUMENTS

| | | | |
|---|---|---|---|
| EP | 0 812 502 B1 | 8/2004 | H04L 12/28 |
| EP | 0 740 873 B1 | 12/2005 | H04L 12/44 |
| WO | WO 95/12942 | 5/1995 | H04L 12/44 |
| WO | WO 96/10307 | 4/1996 | H04L 12/28 |
| WO | WO 96/10307 A1 | 4/1996 | H04L 12/28 |
| WO | WO 00/54237 | 9/2000 | G08B 23/00 |
| WO | WO 01/26334 A2 | 4/2001 | H04L 29/06 |
| WO | WO 01/55865 A1 | 8/2001 | G06F 13/00 |
| WO | WO 03/015452 | 2/2003 | H04Q 9/00 |
| WO | WO 2005/091303 | 9/2005 | G06F 9/445 |
| WO | WO 2006/059195 | 6/2006 | G05D 3/12 |
| WO | WO 2007/015822 | 8/2007 | H04L 12/28 |
| WO | WO 2007/132473 | 11/2007 | G08C 17/00 |
| WO | WO 2008/027457 | 3/2008 | G08B 23/00 |
| WO | WO 2008/033287 A2 | 3/2008 | G08B 23/00 |
| WO | WO 2008/033514 A2 | 3/2008 | G08B 25/00 |
| WO | WO 2008/038072 A1 | 4/2008 | H04Q 7/24 |
| WO | WO 2008/092268 A1 | 8/2008 | G01D 7/06 |
| WO | WO 2009/067251 | 5/2009 | G08C 19/00 |

OTHER PUBLICATIONS

Trilliant Networks, "The Trilliant AMI Solution," RFP SCP-07003, 50 pp., Mar. 22, 2007.
"ZigBee Smart Energy Profile Specification," ZigBee Profile 0x0109, Revision 14, Document 075356r14, 202 pp., May 29, 2008.
Hubaux, J. P., et al. "Towards Mobile Ad-Hoc WANs: Terminodes," 2000 IEEE, Wireless Communications and Networking Conference, WCNC, vol. 3, pp. 1052-1059, 2000.
Miklos, G., et al., "Performance Aspects of Bluetooth Scatternet Formation," First Annual Workshop on Mobile and Ad Hoc Networking and Computing, MobiHOC 2000, pp. 147-148, 2000.
Eng, K. Y., et al. "BAHAMA: A Broadband Ad-Hoc Wireless ATM Local-Area Network," 1995 IEEE International Conference on Communications, ICC '95 Seattle, 'Gateway to Globalization', vol. 2, pp. 1216-1223, Jun. 18-22, 1995.
Lee, David J. Y., "Ricocheting Bluetooth," 2nd International Conference on Microwave and Millimeter Wave Technology Proceedings, ICMMT 2000, pp. 432-435, 2000.
Lilja, Tore, "Mobile Energy Supervision," Twenty-second International Telecommunications Energy Conference, 2000 INTELEC, pp. 707-712, 2000.
Parkka, Juha, et al., "A Wireless Wellness Monitor for Personal Weight Management," Proceedings of the 2000 IEEE EMBS International Conference on Information Technology Applications in Biomedicine, pp. 83-88, 2000.
Broch, J., et al., "Supporting Hierarchy and Heterogeneous Interfaces in Multi-Hop Wireless Ad Hoc Networks," Proceedings of the Fourth International Symposium on Parallel Architectures, Algorithms, and Networks (I-SPAN '99), pp. 370-375 (7 pp. with Abstract), Jun. 23-25, 1999.
Privat, G., "A System-Architecture Viewpoint on Smart Networked Devices," Microelectronic Engineering, vol. 54, Nos. 1-2, pp. 193-197, Dec. 2000.
Jonsson, U., et al., "MIPMANET—Mobile IP for Mobile Ad Hoc Networks," MobiHOC 2000, First Annual Workshop on Mobile and Ad Hoc Networking and Computing, pp. 75-85 (12 pp. with Abstract), 2000.
Kapoor, R., et al., "Multimedia Support Over Bluetooth Piconets," First Workshop on Wireless Mobile Internet, pp. 50-55, Jul. 2001.
Sung-Yuan, K., "The Embedded Bluetooth CCD Camera," TENCON, Proceedings of the IEEE Region 10 International Conference on Electrical and Electronic Technology, vol. 1, pp. 81-84 (5 pp. with Abstract), Aug. 19-22, 2001.
Lim, A., "Distributed Services for Information Dissemination in Self-Organizing Sensor Networks," Journal of the Franklin Institute, vol. 338, No. 6, pp. 707-727, Sep. 2001.
Meguerdichian, S., et al., "Localized Algorithms in Wireless Ad-Hoc Networks: Location Discovery and Sensor Exposure," ACM Symposium on Mobile Ad Hoc Networking & Computing, MobiHOC 2001, pp. 106-116, Oct. 2001.
Lilakiatsakun, W., et al. "Wireless Home Networks Based on a Hierarchical Bluetooth Scatternet Architecture," Proceedings of the Ninth IEEE International Conference on Networks, pp. 481-485 (6 pp. with Abstract), Oct. 2001.
Jha, S., et al., "Universal Network of Small Wireless Operators (UNSWo)," Proceedings of the First IEEE/ACM International Symposium on Cluster Computing and the Grid, pp. 626-631 (7 pp. with Abstract), 2001.
"AMRON Technologies Successfully Deploys Advanced Metering Solution for C&I Customers Using Bluetooth" [online], Sep. 2, 2004 [retrieved on Jan. 2, 2009], 3 pp., Retrieved from the Internet: http://www.techweb.com/showpressrelease?articleId=X234101&CompanyId=3.
Utility Intelligence, "Exclusive Distributors of Dynamic Virtual Metering" [online], Copyright 2004-2005 [retrieved on May 12, 2005], Retrieved from the Internet:http://www.empoweringutilities.com/hardware.html, 29 pp.
"AMRON Meter Management System" [online], [retrieved on May 12, 2005], 41 pp., Retrieved from the Internet: http://www.amronm5.com/products/.
Reexamination U.S. Appl. No. 90/008,011, filed Jul. 24, 2006, 75 pp.
Broch, Josh, et al., "A Performance Comparison of Multi-Hop Wire-

(56) References Cited

OTHER PUBLICATIONS less Ad Hoc Network Routing Protocols," *Proceedings of the Fourth Annual ACM/IEEE International Conference in Mobile Computing and Networking* (*MobiCom '98*), Dallas, Texas, 13 pp., Oct. 25-30, 1998.
Broch, Josh, et al., "The Dynamic Source Routing Protocol for Mobile Ad Hoc Networks" [online], Mar. 13, 1998 [retrieved on Feb. 24, 2009], 31 pp., Retrieved from the Internet: htts://tools,ietf.org/draft-ietf-manet-dsr-00.txt.
Katz, Randy H. and Brewer, Eric A., "The Case for Wireless Overlay Networks," *Electrical Engineering and Computer Science Department, University of California, Berkeley*, 12 pp., 1996.
Johnson, David B., "Routing in Ad Hoc Networks of Mobile Hosts," *IEEE*, pp. 158-163, 1995.
Nachum Shacham, Edwin B. Brownrigg, & Clifford A. Lynch, *A Packet Radio Network for Library Automation*, 1987 IEEE Military Communications Conference, vol. 2 at 21.3.1, (Oct. 1987). (TN-IP 0004176-82).
Nachum Shacham & Janet D. Tornow, Future Directions in Packet Radio Technology, Proc. of the IEEE Infocom 1985 at 93 (Mar. 1985). (TN-IP 0005080-86), 17 pp.
John Jubin & Janet D. Tornow, The DARPA Packet Radio Network Protocols, Proc. of the IEEE, vol. 75, No. 1 at 21 (Jan. 87). (TN-IP 0004930-41).
John Jubin, Current Packet Radio Network Protocols, Proc. of the IEEE Infocom1985 at 86 (Mar. 1985), (TN-IP 0004921-29), 9 pp.
David B. Johnson & David A. Maltz, Dynamic Source Routing in Ad Hoc Wireless Networks, reprinted in Mobile Computing, 153, Kluwer Academic Publishers (Tomasz Imielinski & Henry F. Korth eds., 1996), (TN-IP 0006929-46), 18 pp.
David B. Johnson, Mobile Host Internetworking Using IP Loose Source Routing, Carnegie Mellon University CMU-CS-93-128, DARPA Order No. 7330 (Feb. 1993), (TN-IP 0006911-28), 18 pp.
Daniel M. Frank, Transmission of IP Datagrams Over NET/ROM Networks, Proc. of the ARRL 7th Computer Networking Conference 1988 at 65 (Oct. 1988), (TN-IP 0006591-96), 6 pp.
Robert E. Kahn, et al., Advances in Packet Radio Technology, Proc. of the IEEE, vol. 66, No. 11, pp. 1468-1496 (Nov. 1978), (TN-IP 0004942-71).
Clifford A. Lynch & Edwin B. Brownrigg, Packet Radio Networks, Bergamon Press, 259-74 (1987), (TN-IP 0004018-175).
Charles E. Perkins & Pravin Bhagwat, Highly Dynamic Destination-Sequenced Distance-Vector Routing (DSDV) for Mobile Computers, ACM SIGCOMM Computer Communication Review, vol. 24, Issue 4 at 234 (Oct. 1994), (TN-IP 0005018-28), 11 pp.
William MacGregor, Jil Westcott, & Michael Beeler, Multiple Control Stations in Packet Radio Networks, 1982 IEEE Military Communications Conference, vol. 3 at 10.3-1 (Oct. 1982), (TN-IP 0004988-93), 6 pp.
Nachum Shacham & Jil Westcott, Future Directions in Packet Radio Architectures and Protocols, Proc. of the IEEE, vol. 75, No. 1 at 83 (Jan. 1987), (TN-IP 0008712-28), 17 pp.
David B. Johnson and David A. Maltz, Protocols for Adaptive Wireless and Mobile Networking, IEEE Personal Communications, Feb. 1996, p. 34-42.
Arek J. Dadej and Daniel Floreani, Interconnected Mobile Radio Networks—A step Towards Integrated Multimedia Military Communications, Communications and Networks for the Year 2000, IEEE Singapore International Conference on Networks/International Conference on Information Engineering '93, vol. 1, p. 152-156.
David A. Beyer, Accomplishments of the DARPA SURAN Program, IEEE MILCOM 1990, p. 39.6.1-8.
William S. Hortos, Application of Neural Networks to the Dynamic Spatial Distribution of Nodes within an Urban Wireless Network, SPIE, vol. 2492, p. 58-70, 1995.
Nachum Shacham and Richard G. Ogier, Network Control and Data Transport for C3I Applications, IEEE 1987, p. 30.5.1-6.
John E. Rustad, Reidar Skaug, and Andreas Aasen, New Radio Networks for Tactical Communication, IEEE Jornal on Selected Areas in Communications, vol. 8, No. 5, p. 713-27, Jun. 1990.

Barry M. Leiner, Donald L. Nielson, and Fouad A. Tobagi, Issues in Packet Radio Network Design, Proceedings of the IEEE, vol. 75, No. 1, p. 6-20, Jan. 1987.
Janet Tornow, Functional Summary of the DARPA SURAP1 Network, DARPA, Sep. 1986, 17 pp.
John F. Shoch and Lawrence Stewart, Interconnecting Local Networks via the Packet Radio Network, Sixth Data Communications Symposium, Nov. 1979, pp. 153-158.
J.R. Cleveland, Performance and Design Considerations for Mobile Mesh Networks, IEEE MILCOM 96, vol. 1, p. 245-49.
Cmdr. R. E. Bruninga, USN, A Worldwide Packet Radio Network, Signal, vol. 42, No. 10, p. 221-230, Jun. 1988.
Nachum Shacham and Janet Tornow, Packet Radio Networking, Telecommunications, vol. 20, No. 9, p. 42-48, 64, 82, Sep. 1986.
Spencer T. Carlisle, Edison's NetComm Project, IEEE 1989, Paper No. 89CH2709-4-B5, p. B5-1-B5-4.
Brian H. Davies and T.R. Davies, The Application of Packet Switching Techniques to Combat Net Radio, Proceedings of the IEEE, vol. 75, No. 1, p. 43-55, Jan. 1987.
Fouad A. Tobagi, Richard Binder, and Barry Leiner, Packet Radio and Satellite Networks, IEEE Communications Magazine, vol. 22, No. 11, p. 24-40, Nov. 1984.
M. Scott Corson, Joseph Macker, and Stephen G. Batsell, Architectural Considerations for Mobile Mesh Networking, IEEE MILCOM 96, vol. 1, p. 225-9.
K.Y. Eng, et. al., Bahama: A Broadband Ad-Hoc Wireless ATM Local-Area Network, 1995 IEEE International Conference on Communications, vol. 2, p. 1216-23, Jun. 18-22, 1995.
J. Jonquin Garcia-Luna-Aceves, A Fail-Safe Routing Algorithm for Multihop Packet-Radio Networks, IEEE Infocom '86, p. 434-43, Apr. 8-10, 1986.
Johanes P. Tamtomo, A Prototype of TCP/IP-Based Internet-PRNET for Land Information Networks and Services, Department of Surveying Engineering, University of New Brunswick, Jan. 25, 1993, 118 pp.
A. Alwan, et al., Adaptive Mobile Multimedia Networks, IEEE Personal Communications, p. 34-51, Apr. 1996.
Michael Ball, et al., *Reliability of Packet Switching Broadcast Radio Networks*, IEEE Transactions on Circuits and Systems, vol. Cas-23, No. 12, p. 806-13 ,Dec. 1976.
Kenneth Brayer, Implementation and Performance of Survivable Computer Communication with Autonomous Decentralized Control, IEEE Communications Magazine, p. 34-41, Jul. 1983.
Weidong Chen and Eric Lin, *Route Optimization and Locations Updates for Mobile Hosts*, Proceedings of the 16$^{th}$ ICDSC, p. 319-326, 1996.
Daniel Cohen, Jonathan B. Postel, and Raphael Rom, *IP Addressing and Routing in a Local Wireless Network*, IEEE Infocom 1992, p. 5A.3.1-7.
Charles Perkins and David B. Johnson, *Mobility Support in IPv6*, Sep. 22, 1994, http//www.monarch.cs.rice.edu/internet-drafts/draft-perkins-ipv6-mobility-sup-00.txt (last visited Sep. 26, 2009.
Jonathan J. Hahn and David M. Stolle, *Packet Radio Network Routing Algorithms: A Survey*, IEEE Communications Magazine, vol. 22, No. 11, p. 41-7, Nov. 1984.
David A. Hall, *Tactical Internet System Architecture for the Task Force XXI*, IEEE 1996, p. 219-30.
Robert Hinden and Alan Sheltzer, *The DARPA Internet Gateway*, DARPA RFC 823, Sep. 1982, 45 pp.
Manuel Jimenez-Cedeno and Ramon Vasquez-Espinosa, *Centralized Packet Radio Network: A Communication Approach Suited for Data Collection in a Real-Time Flash Flood Prediction System*, Dept. of Electrical and Computer Engineering, University of Puerto Rico-Mayaguez, ACM 0-89791-568-2/93, p. 709-13, 1993.
David B. Johnson, *Routing in Ad Hoc Networks of Mobile Hosts*, Workshop on Mobile Computing Systems and Applications, Dec. 8-9, 1994, Santa Cruz, California, IEEE 1995, p. 158-63.
David B. Johnson, *Route Optimization in Mobile IP*, Nov. 28, 1994, http://www.monarch.cs.rice.edu/internet-drafts/draft-ietf-mobileip-optim-00.txt (last visited Sep. 26, 2009), 32 pp.

(56) References Cited

OTHER PUBLICATIONS

Mark G. Lewis and J.J. Garcia-Luna-Aceves, *Packet-Switching Applique for Tactical VHF Radios*, 1987 IEEE MILCOM Communciations Conference, Oct. 19-22, 1987, Washington, D.C., p. 21.2.1-7.
Sioe Mak and Denny Radford, *Design Considerations for Implementation of Large Scale Automatic Meter Reading Systems*, IEEE Transactions on Power Delivery, vol. 10, No. 1, p. 97-103, Jan. 1995.
Charles E. Perkins and Pravin Bhagwat, *A Mobile Networking System Based on Internet Protocol*, IEEE Personal Communications, First Quarter 1994, IEEE 1994, p. 32-41.
Richard Schulman, Richard Snyder, and Larry J. Williams, *SINCGARS Internet Controller—Heart of the Digitized Battlefield*, Proceedings of the 1996 Tactical Communications Conference, Apr. 30-May 2, 1996, Fort Wayne, Indiana, p. 417-21.
Nachum Shacham and Earl J. Craighill, *Dynamic Routing for Real-Time Data Transport in Packet Radio Networks*, Proceedings of INFOCOM 1982, IEEE 1982, p. 152-58.
R. Lee Hamilton, Jr. and Hsien-Chuen Yu, *Optimal Routing in Multihop Packet Radio Networks*, IEEE 1990, p. 389-96.
Carl A. Sunshine, *Addressing Problems in Multi-Network Systems*, Proceedings of INFOCOM 1982, IEEE 1982, p. 12-18.
J.J. Garcia-Luna-Aceves, *Routing Management in Very Large-Scale Networks*, North-Holland, Future Generations Computer Systems 4, 1988, pp. 81-93.
J.J. Garcia-Luna-Aceves, *A Minimum-hop Routing Algorithm Based on Distributed Information*, North-Holland, Computer Networks and ISDN Systems 16, 1988/89, p. 367-382.
D. Hubner, J. Kassubek, F. Reichert, *A Distributed Multihop Protocol for Mobile Stations to Contact A Stationary Infrastructure*, Third IEE Conference on Telecommunications, Conference Publication No. 331, p. 204-7.
Jens Zander and Robert Forchheimer, *The SOFTNET Project: A Retrospect*, IEEE EUROCON, Jun. 13-17, 1988, p. 343-5.
Mario Gerla and Jack Tzu-Chich Tsai, *Multicluster, Mobile, Multimedia Radio Network*, Wireless Networks 1, J.C. Baltzer AG, Science Publishers, 1995, p. 255-265.
F. G. Harrison, *Microwave Radio in the British TeleCom Access Network*, Second IEE National Conference on Telecommunications, Conference Publication No. 300, Apr. 2-5, 1989, p. 208-13.
Chai-Keong Toh, *A Novel Distributed Routing Protocol to Support Ad-Hoc Mobile Computing*, Conference Proceedings of the 1996 IEEE Fifteenth Annual International Phoenix Conference on Computers and Communications, Mar. 27-29, 1996, p. 480-6.
Fadi F. Wahhab, *Multi-Path Routing Protocol for Rapidly Deployable Radio Networks*, Thesis submitted to the Department of Electrical Engineering and Computer Science of the University of Kansas, 1994, 59 pp.
Jil Westcott and Gregory Lauer, *Hierarchical Routing for Very Large Networks*, IEEE MILCOM 1984, Oct. 21-24, 1984, Conference Record vol. 2, p. 214-8.
International Search Report and Written Opinion for Application No. PCT/US08/13027, dated Feb. 9, 2009, 6 pp.
International Search Report and Written Opinion for Application No. PCT/US08/13023, dated Jan. 12, 2009, 10 pp.
International Search Report and Written Opinion for Application No. PCT/US08/13019, dated Jan. 12, 2009, 13 pp.
International Search Report and Written Opinion for Application No. PCT/US08/13025, dated Jan. 13, 2009, 7 pp.
International Search Report and Written Opinion for Application No. PCT/US08/13018, dated Jan. 30, 2009, 9 pp.
International Search Report and Written Opinion for Application No. PCT/US08/13020, dated Jan. 9, 2009, 8 pp.
International Search Report and Written Opinion for Application No. PCT/US08/13028, dated Jan. 15, 2009, 9 pp.
International Search Report and Written Opinion for Application No. PCT/US08/13021, dated Jan. 15, 2009, 11 pp.
International Search Report and Written Opinion for Application No. PCT/US08/13016, dated Jan. 9, 2009, 7 pp.
International Search Report and Written Opinion for Application No. PCT/US08/13024, dated Jan. 13, 2009, 9 pp.
International Search Report and Written Opinion for Application No. PCT/US08/13022, dated Jan. 27, 2009, 10 pp.
International Search Report and Written Opinion for Application No. PCT/US08/13030, dated Jan. 9, 2009, 7 pp.
International Search Report and Written Opinion for Application No. PCT/US08/12161, dated Mar. 2, 2009, 13 pp.
International Search Report and Written Opinion for Application No. PCT/US08/13017, dated Mar. 18, 2009, 11 pp.
International Search Report and Written Opinion for Application No. PCT/US08/13026, dated Feb. 24, 2009, 9 pp.
International Search Report and Written Opinion for Application No. PCT/US08/13029, dated Feb. 2, 2009, 8 pp.
International Search Report and Written Opinion for Application No. PCT/US08/13032, dated May 12, 2009, 14 pp.
International Search Report and Written Opinion for Application No. PCT/US09/05008, dated Oct. 22, 2009, 8 pp.
Leis, John, "TCP/IP Protocol Family," pp. 1 and 42-43, Apr. 3, 2006.
Supplementary European Search Report for Application No. EP 08 85 1869, dated Dec. 30, 2010, 7 pp.
International Search Report and Written Opinion for Application No. PCT/US10/26956, dated May 19, 2010, 2 pp.
Supplementary European Search Report for Application No. EP 08 85 1132, dated Dec. 6, 2010, 9 pp.
Baumann, R., et al., "Routing Packets Into Wireless Mesh Networks," *Wireless and Mobile Computing, Networking and Communications*, 2007, WIMOB 2007, Third IEEE International Conference, Piscataway, NJ, Oct. 8, 2007, p. 38 (XP031338321).
Levis Stanford University, J. P. Vasseur, Cisco Systems, et al., "Overview of Existing Routing Protocols for Low Power and Lossy Networks," draft-levis-rl2n-overview-protocols-02.txt, IETF Standard-Working-Draft, Internet Engineering Task Force, IETF, Ch, No. 2, Nov. 17, 2007 (XP015054252) (ISSN: 0000-0004).
Culler Arch Rock, J.P. Vasseur, Cisco Systems, et al., "Routing Requirements for Low Power and Lossy Networks, draft-culler-rl2n-routing-reqs-01.txt," IETF Standard-Working-Draft, Internet Engineering Task Force, IETF, CH, No. 1, Jul. 7, 2007 (XP015050851) (ISSN: 000-0004).
Perkins, C. E., et al., "Ad Hoc On-Demand Distance Vector (AODV) Routing," Network Working Group Internet Draft, XX, Nov. 9, 2001 (XP002950167).
Postel, J., "RFC 793 Transmission Control Protocol," Sep. 1981 [retrieved on Jan. 1, 2007], Retrieved From the Internet: http://www.ietf.org/rfc/rfc0793.txt.
Supplementary European Search Report for Application No. EP 08 85 1927, dated Dec. 22, 2010, 10 pp.
Younis, M., et al., "Energy-Aware Routing in Cluster-Based Sensor Networks," Modeling, Analysis and Simulation of Computer and Telecommunications Systems, 10$^{th}$ IEEE Proceedings on Mascots, Oct. 11-16, 2002, Piscataway, NJ (XP010624424) (ISNB: 978-0-7695-1840-4).
Supplementary European Search Report for Application No. EP 08 85 3052, dated Mar. 18, 2011, 10 pp.
Supplementary European Search Report for Application No. EP 08 85 1560, dated Mar. 24, 2011, 9 pp.
Supplementary European Search Report for Application No. EP 08 85 2992, dated Mar. 23, 2011, 6 pp.
International Search Report and Written Opinion for Application No. PCT/US2011/051290, dated Jan. 6, 2012, 11 pp.

PROCESS FOR DETECTING ENERGY THEFT

CROSS-REFERENCE TO RELATED APPLICATIONS

The present application claims benefit of similarly titled U.S. provisional patent application Ser. No. 61/382,057 filed Sep. 13, 2010, which is incorporated herein by reference in its entirety.

FIELD OF THE INVENTION

The present invention relates generally to detecting energy theft within an energy distribution system. More particularly, the present invention relates to systems and methods for detecting energy discrepancies in voltages and/or currents reported by different electric meters present in a distribution circuit, without requiring installation of additional hardware at the transformer.

BACKGROUND OF THE INVENTION

Electricity theft is a problem that all electric utilities face. In fact, it is estimated that energy theft costs utilities billions of dollars annually, and these losses generally are passed along to customers in the form of higher rates. Unfortunately, electricity theft via fraud (meter tampering) or stealing (illegal connections) can also create situations that endanger lives and property.

An existing system and process for detecting energy theft includes first installing a meter at a distribution transformer. Energy theft is then detected if the energy measured at the transformer is greater than the aggregated energy reported by the electric meters installed at the different premises connected to the distribution transformer. This method is effective, but requires installation and maintenance of an extra meter for each distribution transformer.

Accordingly, there is a need in the art for systems and processes that effectively detect or identify potential energy theft, without the need for additional hardware implementation beyond the hardware (e.g., electric meters) installed at customer premises.

SUMMARY OF THE INVENTION

The exemplary embodiments herein describe a method that allows detection of energy theft solely based on the analysis of the information provided by the electric meters at the different customer premises connected to a transformer. The invention allows for such detection without the need for additional hardware installation.

In one aspect of the invention, a system is provided including a transformer, a first electric meter, and a second electric meter connected to a server. The first electric meter is connected to the transformer via a first electrical line, and the second electric meter is connected to the transformer via a second electrical line. The second electric meter is located a farther distance from the transformer than the first electric meter. The server determines the location of the first electric meter and the second electric meter with respect to the transformer. Once the location of the meters is determined, the server estimates the resistance along the electrical line located the farthest from the transformer (i.e., the second electrical line). The server may then calculate an expected voltage for the second electric meter based on the estimated resistance of the second electrical line. The server receives one or more actual voltage readings for the second electric meter and compares the expected voltage for the second electric meter with the one or more actual voltage readings for the second electric meter. The server can determine the existence of line loss along the second electrical line if there is a difference between the expected voltage and the actual voltage readings that is greater than a predetermined threshold.

In another aspect of the invention, the server may also estimate the resistance along the first electrical line. The server calculates an expected voltage for the first electric meter based on the estimated resistance of the second electrical line and the estimated resistance of the first electrical line. Actual voltage readings for the first electric meter are then received, and may be compared to the calculated expected voltage for the first electric meter. The server can determine the existence of line loss along the first electrical line if there is a difference between the expected voltage and the actual voltage readings that is greater than a predetermined threshold.

In yet another aspect of the invention, a process for detecting the existence of line loss in electric meters present in a distribution circuit is provided. The process includes determining, by a processor, the location of each of at least two meters with respect to a transformer of the distribution circuit, each of the meters in electrical communication with an electrical line. The process also includes estimating, by the processor, a resistance of the electrical line at the location of each of the at least two meters, starting with a line resistance farthest from the transformer. Once the resistances are estimated, the process continues by calculating estimated line voltages for at least one electric meter using the estimated line resistances. The process then includes receiving, by the processor, actual voltage readings for the at least one electric meter such that a comparison of the estimated line voltage with the actual voltage readings for the at least one electric meter may be made. Finally, the process includes determining, by the processor, the existence of line loss if one or more of the comparisons result in a difference that is greater than a predetermined threshold.

These and other aspects of the invention will be better understood by reading the following detailed description and appended claims.

DETAILED DESCRIPTION

All terms used herein are intended to have their ordinary meaning in the art unless otherwise provided.

An exemplary embodiment allows for energy theft detection in a distribution circuit. Typically, a distribution circuit carries electricity from a transmission system and delivers it to consumer locations. The distribution circuits described herein typically comprise a transformer, which reduces distribution voltage to the relatively low voltages (e.g., 1 kV) required by lighting and interior wiring systems. The transformer may be pole-mounted or set on the ground in a protective enclosure. In any event, the transformer is in electrical communication with any number of consumer locations via, for example, an "electrical service" or "service drop" connection (e.g., and electrical wire). Each consumer location typically comprises a meter to determine the amount of electricity consumed at the location.

In one embodiment, the inventive methods require that at least two electric meters are present in the distribution circuit. Moreover, instantaneous current and voltage information should be available from all the delivery points (e.g., meters) within the transformer.

Equivalent Circuit

Figure 1:
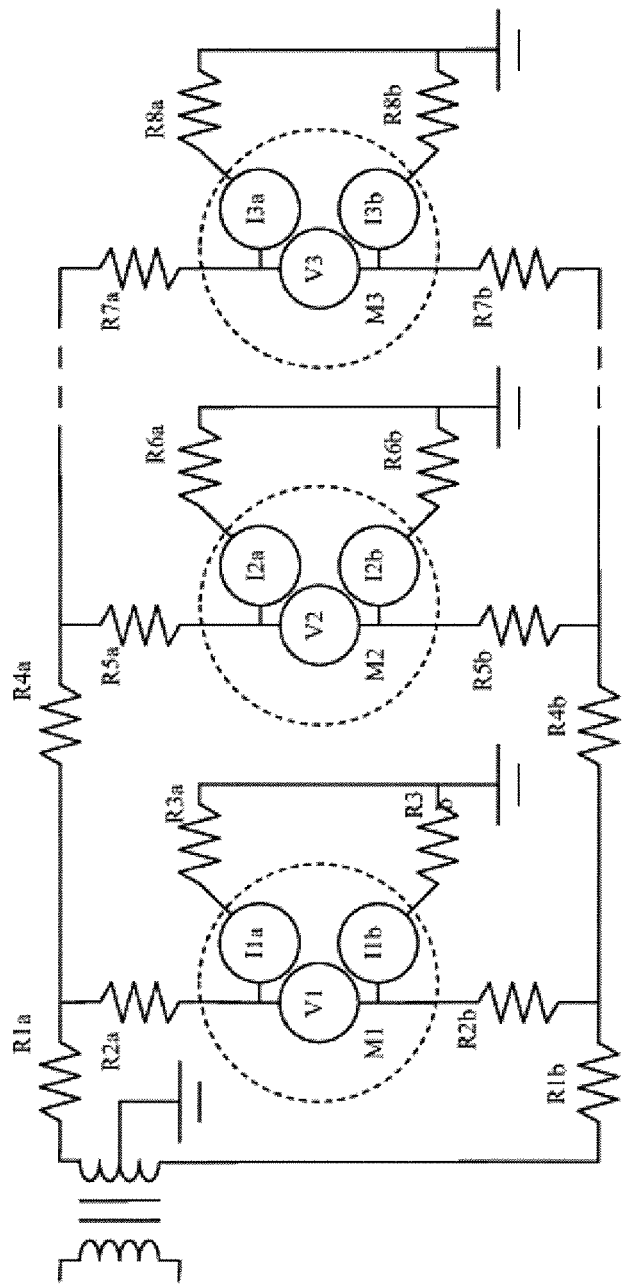
FIG. 1 is a schematic showing an example of a residential distribution circuit with a representative three meters.

An exemplary residential distribution circuit in is illustrated in FIG. 1. As shown, the circuit comprises a number of electric meters (M1, M2, and M3), such as those that are typically employed in North America to measure electricity usage at a location (e.g., a home, apartment, other residence, office or the like). Each of the meters (M1, M2, and M3) are adapted to report an instantaneous voltage (V1, V2, V3) and instantaneous current (I1a, I1b, I2a, I2b, I3a, and I3b) corresponding to instantaneous electricity usage at the location. Moreover, each of the meters may experience an aggregate load during such electricity usage, which may be represented in the circuit diagram, for example, by any number of resistors on both sides of the circuit (e.g., R3a, R3b, R6a, R6b, R8a, and R8b).

The electricity distribution circuit is shown to experience a resistance along the main electricity distribution line. The resistance may be modeled or represented by any number of resistors (e.g., R1a, R1b, R4a and R4b). Additionally, the circuit experiences a resistance along each line feeding to the multiple locations, wherein such resistance may be represented by any number of resistors (e.g., R2a, R2b, R5a, R5b, R7a, and R7b).

Figure 2:
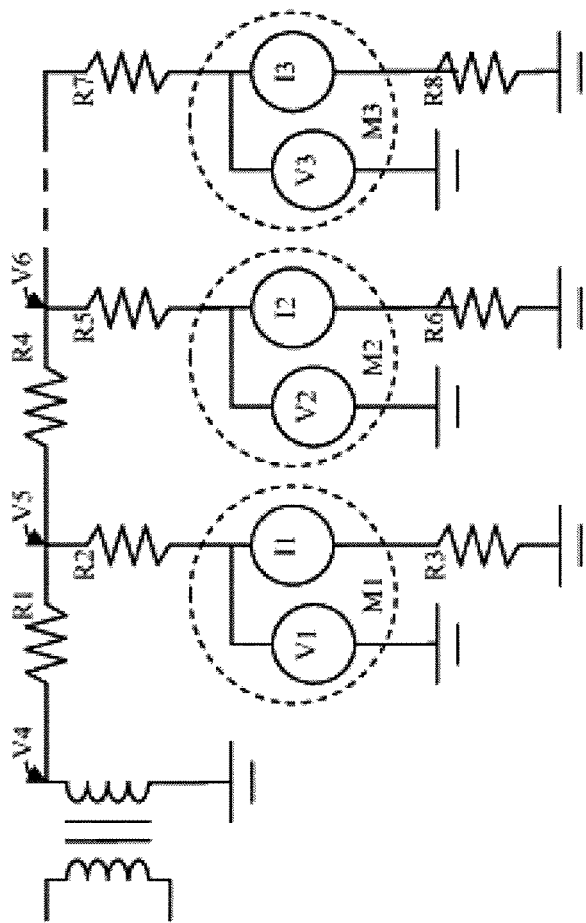
FIG. 2 is a simplified schematic of FIG. 1.

Referring to FIG. 2, the schematic of FIG. 1 is shown in a simplified state, where it assumed that the resistances of the conductors for both sides of the circuit are equal (i.e., R1a=R1b, R2a=R2b, R4a=R4b, R6a=R6b, R7a=R7b). As shown, each of the meters (M1, M2, and M3) reports an instantaneous voltage (V1, V2, V3) and instantaneous current (I1=I1a+I1b, I2=I2a+I2b, I3=I3a+I3b) corresponding to instantaneous electricity usage at a location. The aggregate load experienced by each of the meters (M1, M2, and M3) on both sides of the circuit (R3=R3a+R3b, R6=R6a+R6b, R8=R8a+R8b) is shown simply as one resistor per meter.

The resistance seen along the main electricity distribution line is represented by resistors R1 and R4, where R1=R1a=R1b and R4=R4a=R4b. Finally, the resistance along each line feeding to the multiple premises, is represented by resistors R2, R5, and R7, respectively, where R2=R2a=R2b; R5=R5a=R5b; and R7=R7a=R7b.

The exemplary electricity distribution circuit shown in FIG. 2 (and FIG. 1) is a single-phase, 3-wire circuit attached to ANSI Form 4S or 4A meters. Other types of distribution circuits and meter forms are possible in North America and throughout the world, with the inventive methods described herein being applicable to most of them. For example, for three phase distribution circuits, one skilled in the art recognizes that the methods described herein with respect to the exemplary single-phase circuit would need to be repeated for each of the three phases. Further, since the current distribution circuit configuration in Europe need only support 220 V services, not both 110 V and 220 V services, a typical European distribution circuit is in fact equivalent to FIG. 2.

Data Analysis

Still referring to FIG. 2, the presence of non-measured energy in a distribution circuit creates discrepancies in the voltages and currents reported by the different electric meters (M1, M2, and M3) present in the distribution circuit. It has been found that detection of these discrepancies provides a good indication of energy theft and can be used to trigger further investigation.

To enable this analysis, all meters (M1, M2, M3) within a distribution circuit are configured to report instantaneous voltage (V1, V2, V3) and current (I1, I2, I3) samples periodically. For example, the meters may be programmed to report voltage and current readings at time intervals ranging from seconds to hours or even days. It will be appreciated that such samples may be manually determined or automatically determined.

To obtain snapshots in time of the different currents and voltages within the distribution circuit, all meters may be adapted to take their measurements simultaneously. Exemplary meters for use with the embodiments described herein are smart meters and retrofitted meters that include the necessary communications hardware and software including at least one microprocessor, radio, and memory.

Once the instantaneous voltage and current samples are procured, the analysis of the information may be completed in the following three steps:

1. Evaluation of the location of each meter within the distribution line
2. Evaluation of the resistance of the different lines
3. Verification of consistency in the reported voltages In addition to circuitry and meters having the described measuring and reporting functionality, the system for performing the evaluation, verification and other steps of the data collection and analysis processes described herein includes at least a back-end processor programmed with software for implementing the processes. One skilled in the art recognizes that multiple processors, databases, servers, displays and the like may be used in various combinations to implement the invention. Additionally, meter data may be communicated to the back-end processor through wired, wireless or a combination of wired/wireless components and steps.

The methods described herein may be implemented within AMI, AMR, or Advanced Metering Management (AMM) technologies, including systems that measure, collect and analyze utility usage, from advanced devices such as electricity meters, through a network on request or a pre-defined schedule. Such infrastructure typically includes hardware, software, communications, customer-associated systems and meter data management software. The infrastructure collects and distributes information to customers, suppliers, utility companies and service providers.

The technology described herein may be incorporated into systems comprising mesh network technology. Mesh networks typically include at least one mesh gate and at least one mesh device, such as an electrical meter. The mesh gate may communicate with the meters over a mesh network. The mesh gate may also communicate with a server or processor over a wide area network. The mesh gate may form a mesh network with nearby meters and interface between the meters and the server.

Meter Location

To analyze the data, it is important for the system to know or determine the position of each meter (M1, M2, M3) relative to the transformer. In one embodiment, the meter position can be inferred by analyzing the voltages (V1, V2, V3) reported by each meter. The meter consistently reporting the highest voltage will typically be the closest to the transformer. The position of the other meters may then be determined based on their relative voltage.

However, depending on the resistance of the different lines and the current present on each line, it is possible that the voltage reported by a meter closer to the transformer may be less than the voltage reported by meters further down the distribution line. For this reason, in certain embodiments, the position of each meter may be determined statistically based on multiple samples. For example, any number of instantaneous voltage samples may be determined by the system for each meter. The average of the samples may be determined for each meter, and meter positions may be determined based on the average. In other embodiments, the position of each meter may be determined based on the respective median sample voltage of each meter. Of course, the location of the meters may simply be manually entered into the system by, for example, and operator. The operator may also update the meter position as new meters are installed or as older meters are removed.

Resistance Estimation

Still referring to FIG. 2, the resistances (R1, R2, R4, R5, R7) of the different lines can be estimated by using at least two samples of the instantaneous voltages and currents. In one embodiment, this process begins by estimating the resistance of the line farthest from the transformer (e.g., R7).

Figure 3:
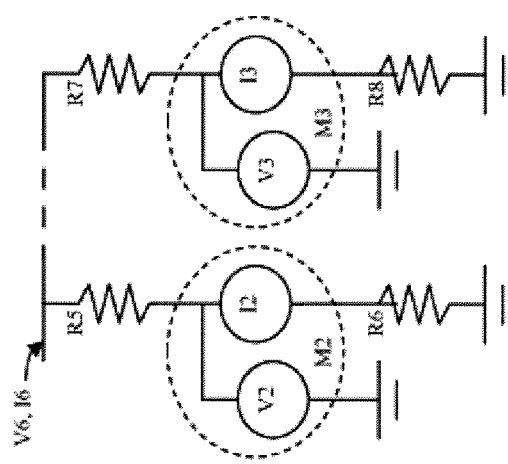
FIG. 3 is a first subcircuit of the schematic of FIG. 2.

Referring to FIG. 3, a first subcircuit of FIG. 2 is shown. The voltage (V6) across R5 can be expressed based on the current and voltage reported by meter M2 (I2, V2) and meter M3 (I3, V3). The following equations show this relationship for a first sample (Sample x):

$$V6x = (R7*I3x) + V3x \quad (1)$$

$$V6x = (R5*I2x) + V2x \quad (2)$$

Using these equations, the relationship between resistances R5 and R7 may be expressed as follows:

$$R5 = \frac{(R7*I3x) + V3x - V2x}{I2x} \quad (3)$$

A second sample (Sample y) may then be obtained to determine a second equation for R5:

$$R5 = \frac{(R7*I3y) + V3y - V2y}{I2y} \quad (4)$$

Combining equations 3 and 4, the value of R7 may be expressed as:

$$R7 = \frac{(V3y*I2x) + (V2x*I2y) - (V2y*I2x) - (V3x*I2y)}{(I3x*I2y) - (I3y*I2x)} \quad (5)$$

Using the same technique, the resistance R5 can computed as follows:

$$R5 = \frac{(V2y*I3x) + (V3x*I3y) - (V3y*I3x) - (V2x*I3y)}{(I2x*I3y) - (I2y*I3x)} \quad (6)$$

Each following stage in the distribution circuit can be estimated using the same method described above. To obtain the same condition as above, the voltage and current of the distribution line are estimated using the resistances previously computed. For example, the corresponding samples of V6 and I6 may be computed using R7 as follows:

$$V6x = (R7*I3x) + V3x \quad (7)$$

$$V6y = (R7*I3y) + V3y \quad (8)$$

$$I6x = I2x + I3x \quad (9)$$

$$I6y = I2y + I3y \quad (10)$$

Figure 4:
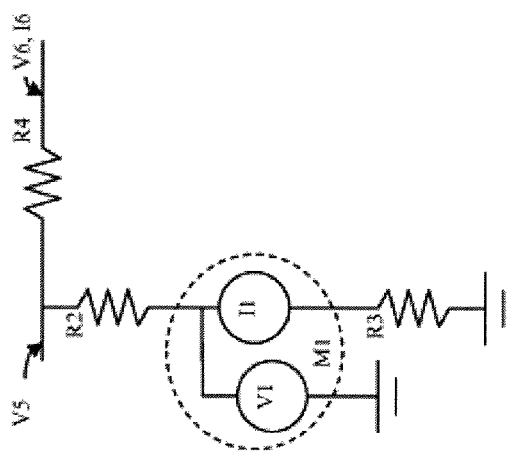
FIG. 4 is a second subcircuit of the schematic of FIG. 2.

Referring to FIG. 4, a second subcircuit of FIG. 2 is shown. Once the above calculations are computed, the following two resistances (R2 and R4) can be computed as shown in the equations below:

$$R4 = \frac{(V6y*I1x) + (V1x*I1y) - (V1y*I1x) - (V6x*I1y)}{(I6x*I1y) - (I6y*I1x)} \quad (11)$$

$$R2 = \frac{(V1y*I6x) + (V6x*I6y) - (V6y*I6x) - (V1x*I6y)}{(I1x*I6y) - (I1y*I6x)} \quad (12)$$

The quality of this estimate depends on the precision of the measurements and the different currents present during these measurements—a higher current typically produces a more accurate estimate since measurement errors are smaller relative to the higher reading. For this reason, multiple sample sets may be used to produce multiple estimates which may then be averaged or from which the median value may be ascertained.

Typically, the samples used should be different to avoid a division by zero when computing the resistances. Accordingly, sample sets that produce a division by zero may be discarded.

Voltage Consistency

Once the location of each meter within the distribution circuit is known and the different resistances are estimated, each sample reported by the meters can be used to compare the voltage reported by the meters and the voltage computed based on the reference circuit.

For example, using the reference circuit defined by FIG. 2, the voltages may be represented as follows:

$$V5 = V1 + (R2*I1) \quad (13)$$

$$V6 = V5 - (R4*(I2+I3)) \quad (14)$$

$$V2' = V6 - (R5*I2) \quad (15)$$

$$V3' = V6 - (R7*I3) \quad (16)$$

The percentage of discrepancy can be computed by comparing the voltage reported by the meter (V2, V3) and the voltage computed by the reference circuit (V2', V3'):

$$\% \text{ discrepancy} = \frac{\text{absolute}(V2' - V2)}{V2} * 100 \quad (17)$$

$$\% \text{ discrepancy} = \frac{\text{absolute}(V3' - V3)}{V3} * 100 \quad (18)$$

Equations (17) and (18) are reflective of measured discrepancy with respect to M2 and M3, respectively.

Possible energy theft is signaled when the percentage of discrepancy is higher than a certain threshold. For example, if the percentage of discrepancy of the voltage reported by the meter and the voltage computed by the reference circuit exceeds about 50%, about 25%, about 10%, about 5%, about 1% or even about 0.5%, a possible energy theft may be occurring at the corresponding location in the distribution circuit. Accordingly, in one embodiment, if the percent discrepancy exceeds the threshold, the system may raise a flag or otherwise alert an operator. The operator may then investigate the discrepancy and correct the situation For simplicity, the different equations presented have been based on the reference circuit shown in FIG. 2 containing three electric meters. One skilled in the art recognized that the same logic applies to any distribution circuit with at least two meters.

Unless specifically stated otherwise as apparent from the foregoing discussion, it is appreciated that throughout the description, discussions utilizing terms such as "processing" or "computing" or "calculating" or "determining" or "displaying" or the like, can refer to the action and processes of a data processing system, or similar electronic device, that manipulates and transforms data represented as physical (electronic) quantities within the system's registers and memories into other data similarly represented as physical quantities within the system's memories or registers or other such information storage, transmission or display devices.

The exemplary embodiments can relate to an apparatus for performing one or more of the functions described herein. This apparatus may be specially constructed for the required purposes, or it may comprise a general purpose computer selectively activated or reconfigured by a computer program stored in the computer. Such a computer program may be stored in a machine (e.g. computer) readable storage medium, such as, but is not limited to, any type of disk including floppy disks, optical disks, CD-ROMs and magnetic-optical disks, read only memories (ROMs), random access memories (RAMs) erasable programmable ROMs (EPROMs), electrically erasable programmable ROMs (EEPROMs), magnetic or optical cards, or any type of media suitable for storing electronic instructions, and each coupled to a bus.

Some exemplary embodiments described herein are described as software executed on at least one processor, though it is understood that embodiments can be configured in other ways and retain functionality. The embodiments can be implemented on known devices such as a server, a personal computer, a special purpose computer, a programmed microprocessor or microcontroller and peripheral integrated circuit element(s), and ASIC or other integrated circuit, a digital signal processor, a hard-wired electronic or logic circuit such as a discrete element circuit, or the like. In general, any device capable of implementing the processes described herein can be used to implement the systems and techniques according to this invention.

It is to be appreciated that the various components of the technology can be located at distant portions of a distributed network and/or the internet, or within a dedicated secure, unsecured and/or encrypted system. Thus, it should be appreciated that the components of the system can be combined into one or more devices or co-located on a particular node of a distributed network, such as a telecommunications network. As will be appreciated from the description, and for reasons of computational efficiency, the components of the system can be arranged at any location within a distributed network without affecting the operation of the system. Moreover, the components could be embedded in a dedicated machine.

Furthermore, it should be appreciated that the various links connecting the elements can be wired or wireless links, or any combination thereof, or any other known or later developed element(s) that is capable of supplying and/or communicating data to and from the connected elements. The terms determine, calculate and compute, and variations thereof, as used herein are used interchangeably and include any type of methodology, process, mathematical operation or technique.

The invention described and claimed herein is not to be limited in scope by the specific embodiments herein disclosed since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims. All publications cited herein are incorporated by reference in their entirety.

We claim:

1. A system comprising:
a transformer;
a first electric meter in electrical communication with the transformer via a first electrical line;
a second electric meter in electrical communication with the transformer via a second electrical line, the second electric meter located a farther distance from the transformer than the first electric meter;
a server in electrical communication with the transformer, the first electric meter, and the second electric meter, wherein the server:
receives actual voltage and current samples taken substantially simultaneously from both of the first and second electric meters during at least two successive time periods;
determines the location of the first electric meter and the second electric meter with respect to the transformer;
estimates a resistance along the second electrical line based on the received actual voltage and current samples from both of the first and second electric meters taken during the at least two successive time periods;
calculates an expected voltage for the second electric meter based on the estimated resistance of the second electrical line;
compares the expected voltage for the second electric meter with one or more of the actual voltage samples for the second electric meter; and
determines the existence of line loss along the second electrical line if said comparison results in a difference that is greater than a predetermined threshold.

2. A system according to claim 1, wherein the server:
estimates a resistance along the first electrical line based on the received actual voltage and current samples from both of the first and second electric meters taken during the at least two successive time periods;
calculates an expected voltage for the first electric meter based on the estimated resistance of the second electrical line and the estimated resistance of the first electrical line;
compares the calculated expected voltage for the first electric meter with one or more of the actual voltage samples for the first electric meter; and
determines the existence of line loss along the first electrical line if said comparison results in a difference that is greater than the predetermined threshold.

3. A system according to claim 1, wherein the locations of the first and second meters are determined based on one or more voltage samples received from each of the meters.

4. A system according to claim 3, wherein the meter having the lowest voltage sample or lowest average voltage sample of multiple voltage samples is determined to be located the farthest from the transformer.

5. A system according to claim 1, wherein said estimating of the resistance along the second electrical line is based on one or more instantaneous measurements of the current and voltage from the first and second electric meters.

6. A system according to claim 5, wherein said estimating of the resistance along the second electrical line is based on an average of the one or more instantaneous measurements.

7. A system according to claim 1, wherein an operator is notified if line loss is detected.

8. A system according to claim 2, wherein said estimating of the resistance along the first electrical line is based on one or more instantaneous measurements of the current and voltage from the first electric meter.

9. A system according to claim 8, wherein said estimating of the resistance along the first electrical line is based on an average of the one or more instantaneous measurements.

10. A process for detecting the existence of line loss in electric meters present in a distribution circuit, the process comprising:
   receiving, by a processor, actual voltage and current samples taken substantially simultaneously from both of a first and a second electric meter in electrical communication with a transformer in the distribution circuit, during at least two successive time periods;
   determining, by the processor, the location of each of the first and second electric meters with respect to the transformer of the distribution circuit, each of the meters in electrical communication with an electrical line;
   estimating, by the processor, a resistance of the electrical line at the location of each of the first and second meters based on the received actual voltage and current samples from the first and second electric meters taken during the at least two successive time periods, starting with a line resistance farthest from the transformer;
   calculating, by the processor, estimated line voltages for at least one electric meter of the first and second electric meters using the estimated line resistances;
   comparing, by the processor, the estimated line voltage with an actual one or more successive voltage samples for the at least one electric meter; and
   determining, by the processor, the existence of line loss if one or more of comparisons result in a difference that is greater than a predetermined threshold.

11. A process according to claim 10, wherein the location of each of the first and second meters is determined based on one or more voltage samples received from each of the meters.

12. A process according to claim 11, wherein the location of each of the first and second electric meters is determined based on the average of the one or more voltage samples.

13. A process according to claim 12, wherein the meter having the lowest average voltage sample is determined to be located the farthest from the transformer.

14. A process according to claim 11, wherein the location of each of the first and second electric meters is determined based on the median of the one or more voltage samples.

15. A process according to claim 10, wherein said estimating of the resistance is based on successive instantaneous measurements of the current and voltage from the first and second electric meters.

16. A process according to claim 15, wherein said estimating of the resistance is based on an average of the successive instantaneous measurements.

17. A process according to claim 10, further comprising averaging the received actual voltage samples from the at least one electric meter and comparing the averaged actual voltage samples to the estimated line voltage.

18. A process according to claim 10, wherein the predetermined threshold is about 10%.

19. A process according to claim 10, wherein an operator is notified if line loss is detected.

* * * * *